United States Patent
Ahmadi

(10) Patent No.: US 7,692,466 B2
(45) Date of Patent: Apr. 6, 2010

(54) SENSE AMPLIFIER BASED FLIP-FLOP

(75) Inventor: Rubil Ahmadi, Toronto (CA)

(73) Assignee: ATI Technologies ULC, Markham, Ontario (CA)

( * ) Notice: Subject to any disclaimer, the term of this patent is extended or adjusted under 35 U.S.C. 154(b) by 81 days.

(21) Appl. No.: 11/465,590

(22) Filed: Aug. 18, 2006

(65) Prior Publication Data
US 2008/0042713 A1 Feb. 21, 2008

(51) Int. Cl.
*H03K 3/00* (2006.01)
(52) U.S. Cl. .................................. 327/218
(58) Field of Classification Search ............. 327/217, 327/218, 208, 210, 199, 214, 215, 276, 281
See application file for complete search history.

(56) References Cited

U.S. PATENT DOCUMENTS

| 5,023,480 | A | 6/1991 | Gieseke et al. |
| 6,232,810 | B1 | 5/2001 | Oklobdzija et al. |
| 7,012,459 | B2 * | 3/2006 | Sutherland .................. 327/513 |

OTHER PUBLICATIONS

Nikolic, Borivoje et al.; Improved Sense-Amplifier-Based Flip-Flop: Design and Measurements; IEEE J. Solid-State Circuits; 35(6): 876-884, Jun. 2000.
Partovi, H. et al.; Flow-Through Latch and Edge-Triggered Flip-flop Hybrid Elements; Proc. Int. Solid-state Circuits Conf; pp. 138-139; 1996.
Ko, Uming et al.; Design Techniques for High-Performance, Energy-Efficient Control Logic; ISLPED Dig. Tech Papers; pp. 97-100; Aug. 1996.
Stojanovic, Vladimir et al.; Comparative Analysis of Master-Slave Latches and Flip-Flops for High-Performance and Low-Power Systems; IEEE J. Solid-State Circutis; 34(4): 536-548; Apr. 1999.
Strollo, Antonio G.M. et al.; A Novel High-Speed Sense-Amplifier-Based Flip-Flop; IEEE Trans on Very Large Scale Integrated (VLSI) Systems; 13(11):1266-1274; Nov. 2005.
Klass, Fabian et al.; A New Family of Semidynamic and Dynamic Flip-Flops with Embedded Logic for High-Performance Processors; IEEE J. Solid-State Circuits; 34(5): 712-716; May 1999.
Matsui, Masataka et al.; A 200 MHz 13 mm2 2-D DCT Macrocell Using Sense-Amplifying Pipeline Flip-Flop Scheme; IEEE J. Solid-State Circuits; 29(12): 1482-1490; Dec. 1994.
Gerosa, Gian et al.; A 2.2 W, 80 MHz Superscalar RISC Microprocessor; IEEE J. Solid-State Circuits; 29:1440-1452; Dec. 1994.

* cited by examiner

*Primary Examiner*—Lincoln Donovan
*Assistant Examiner*—Diana J Cheng
(74) *Attorney, Agent, or Firm*—Vedder Price P.C.

(57) ABSTRACT

A circuit includes an input stage, an output stage, and a delay stage. The input stage is operative to receive a clock signal and a first and second input signal. The output stage is operative to receive the clock signal. The output stage is also operative to generate a first and second output signal based on the clock signal and the first and second input signals. The delay stage is operatively coupled to the input and output stages. The delay stage includes a first and second branch. The second branch includes at least one more delay element than the first branch.

33 Claims, 4 Drawing Sheets

SENSE AMPLIFIER BASED FLIP-FLOP

FIELD OF THE INVENTION

The present disclosure generally relates to flip-flops, and more particularly to sense amplifier based flip-flops.

BACKGROUND OF THE INVENTION

Flip-flops are key elements in contemporary high-speed integrated circuit design. High clock frequencies are generally gained by using a fine-grained pipeline having minimal logic levels inserted between pipeline stages. Power dissipated by the clock and flip-flops constitute a substantial portion of a total power budget due to the high number of pipeline stages. Therefore, the design of high-performance flip-flops with reduced power dissipation is a major concern in modern high-performance applications. At the same time, die size is a limiting factor that should not be sacrificed for speed or power. In addition, circuit stability and race margin are yet another issues affecting flip-flop selection for high-performance integrated circuits.

A PowerPC Master-Slave Latch (MSL) is one of the fastest classical flip-flop structures known in the art due to a short direct path and a low-power feedback path. The MSL exhibits many favorable characteristics including a small transistor count, which makes it a favorite among skilled artisans. The MSL is also found in many standard cell libraries. However, the MSL has a large clock load, which increases power consumption.

Another known structure is a sense amplifier based flip-flop 10, which is depicted in FIG. 1, also exhibits a small transistor count and therefore a small die size. The sense amplifier based flip-flop 10 has a clock load that is less than the clock load of the MSL and therefore exhibits reduced power consumption.

The sense amplifier based flip-flop 10 includes a sense amplifier stage 12 and a set-reset latch stage 14. The sense amplifier stage 12 is operative to receive a clock signal 16 and complementary input signals 18 and 20. The sense amplifier stage 12 generates a set signal 22 and a reset signal 24 based on the clock signal 16 and the complementary input signals 18, 20. More specifically, when the clock signal 16 is low, nodes 26 and 28 are pre-charged to Vdd and transistors 30 and 32 are on holding their source terminals at "Vdd-Vtn". In this phase, the latch stage 14 holds an output signal 34 at a constant state. At a rising edge of the clock signal 16, the sense amplifier stage 12 senses the complementary input signals 18 and 20 and one of the pre-charged nodes 26 or 28 is pulled down a low level thorough transistor 30 or 32, while the other pre-charged node 26 or 28 remains at Vdd. The latch stage 14 receives signals 22 and 24 and stores new data, which is represented by the complementary signals 18 and 20. When the sense amplifier stage 12 switches, one of transistors 30 or 32 changes a state of nodes 22 or 24 first. After, one of transistors 30 or 32 transition both source terminals are held at ground. Therefore, any subsequent transition of the complementary input signals 18, 20 cannot modify the set and reset signals 22, 24. In addition, transistor 36 is driven by Vdd, which provides for a static operation. More specifically, since transistor 36 is always on, a pull-down path for either node 26 or 28 exists even if the complementary input signals 18, 20 transition while the clock signal 16 is at the high level.

Although this circuit exhibits desirable characteristics, it also suffers from an imbalanced delay, which increases power consumption. More specifically, when the clock signal 16 transitions to a high or low level, the set or reset signal 22, 24 may also transition. The configuration of the sense amplifier stage 12 ensures that the set signal 22 transitions in the same amount of time as the reset signal 24. However, the configuration of the latch stage 14 creates an imbalanced delay. More specifically, when the set signal 22 transitions, a transition of the output signal 34 is delayed by a first delay due to NAND gate 38. When the reset signal 24 transitions, a transition of the output signal 34 is delayed by a second delay that is greater than the first delay due to NAND gates 38 and 40.

In one method, the latch stage 14 is modified to minimize the imbalanced delay. However, modifying the latch stage 14 to minimize the imbalanced delay requires an increased number of transistors, which increases the area of the sense amplifier based flip-flop 10.

It is therefore desirable, among other things, to provide an improved sense amplifier based flip-flop.

BRIEF DESCRIPTION OF THE DRAWINGS

The invention will be more readily understood in view of the following description when accompanied by the below figures and wherein like reference numerals represent like elements.

DETAILED DESCRIPTION

Figure 1:
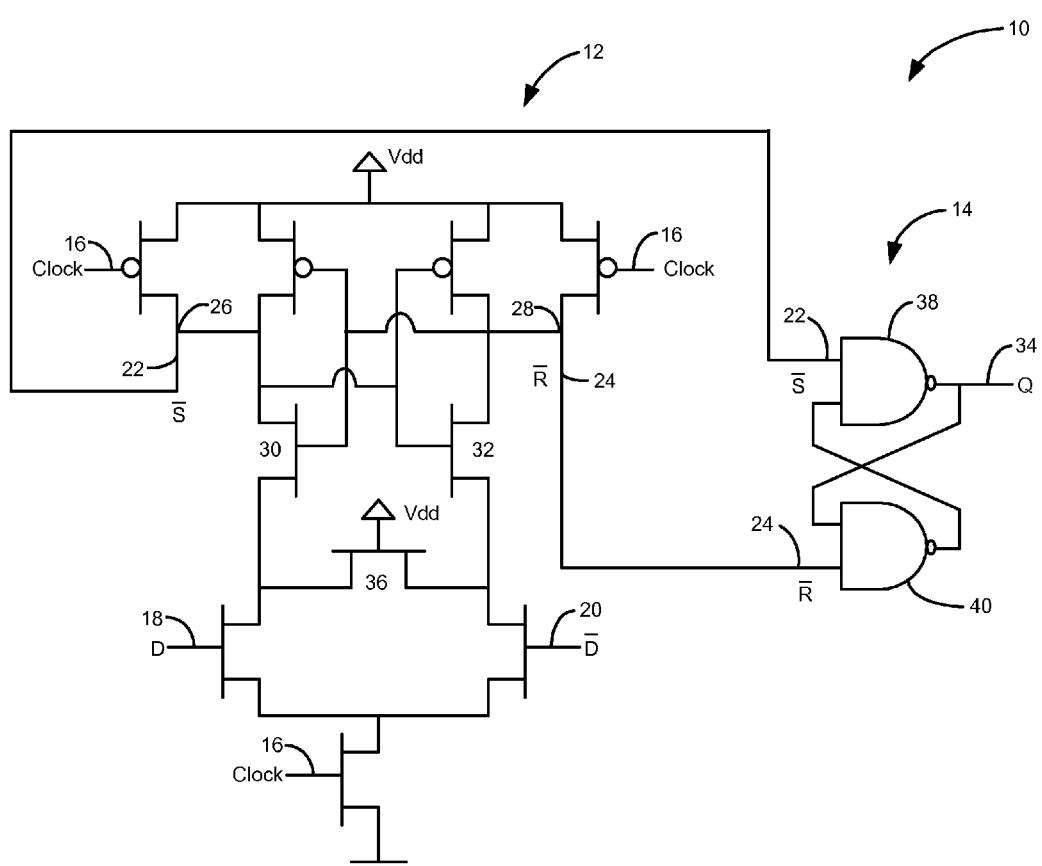
FIG. 1 is an exemplary sense amplifier based flip-flop according to the prior art.

In one example, a circuit includes an input stage, an output stage, and a delay stage. The input stage is operative to receive a clock signal and a first and second input signal. The output stage is operative to receive the clock signal. The output stage is also operative to generate a first and second output signal based on the clock signal and the first and second input signals. The delay stage is operatively coupled to the input and output stages. The delay stage includes a first and second branch. The second branch includes at least one more delay element than the first branch.

In one example, the first branch includes a first transistor having a first terminal, such as a drain, source, or other suitable terminal, a second terminal, such as a drain, source, or other suitable terminal, and a third terminal, such as a gate or other suitable control terminal. The first terminal is operatively coupled to the output stage. The second terminal is operatively coupled to the input stage. The third terminal is operatively coupled to the output stage. The second branch includes a second and third transistor. The second transistor includes a fourth terminal, such as a drain, source, or other suitable terminal, a fifth terminal, such as a drain, source, or other suitable terminal, and a sixth terminal, such as a gate or other suitable control terminal. The third transistor includes a seventh terminal, such as a drain, source, or other suitable terminal and an eighth terminal, such as a drain, source, or other suitable terminal. The fifth terminal is operatively coupled to the input stage. The sixth terminal is operatively coupled to the output stage. The seventh terminal is operatively coupled to the output stage. The eighth terminal is operatively coupled to the fourth terminal.

In one example, the delay element includes a metal oxide semiconductor field effect transistor. The first input signal is an inverse of the second input signal. The first output signal is a set signal and the second output signal is a reset signal.

In one example, the circuit includes a latch stage operatively coupled to the output stage. The latch stage is operative to generate an output signal based on the first and second input signals. In one example, the latch stage is either a set-reset latch or an inverted set-reset latch.

In one example, the latch stage is operative to generate the output signal after a first delay when the first output signal transitions to a high or low level. The latch stage is operative to generate the output signal after a second delay that is greater than the first delay when the second output signal transitions to a high or low level. In one example, the output stage generates the first output signal after the second delay. The output stage generates the second output signal after the first delay.

In one example, the input stage includes a first transistor, a second transistor, a third transistor, and a fourth transistor. The first transistor has a first terminal, such as a drain, source, or other suitable terminal, a second terminal, such as a drain, source, or other suitable terminal, and a third terminal, such as a gate or other suitable control terminal. The first terminal is operatively coupled to the first branch. The third terminal is operative to receive the first input signal. The second transistor has a fourth terminal, such as a drain, source, or other suitable terminal and a fifth terminal, such as a drain, source, or other suitable terminal. The fourth terminal is operatively coupled to the first terminal. The fifth terminal is operatively coupled to the second branch. The third transistor has a sixth terminal, such as a drain, source, or other suitable terminal, a seventh terminal, such as a drain, source, or other suitable terminal and an eighth terminal, such as a gate or other suitable control terminal. The sixth terminal is operatively coupled to the fifth terminal. The seventh terminal is operatively coupled to the second terminal. The eighth terminal is operatively coupled to the second input signal. The fourth transistor has a ninth terminal, such as a drain, source, or other suitable terminal and a tenth terminal, such as a drain, source, or other suitable terminal. The ninth terminal is operatively coupled to the second and seventh terminals. The tenth terminal is operative to receive the clock signal.

In one example, the output stage includes a first, second, third, and fourth transistor. The first transistor has a first terminal, such as a drain, source, or other suitable terminal, a second terminal, such as a drain, source, or other suitable terminal, and a third terminal, such as a gate or other suitable control terminal. The second terminal is operative to provide the first output signal. The third terminal is operative to receive the clock signal. The second transistor has a fourth terminal, such as a drain, source, or other suitable terminal, a fifth terminal, such as a drain, source, or other suitable terminal, and a sixth terminal, such as a gate or other suitable control terminal. The fourth terminal is operatively coupled to the first terminal. The fifth terminal is operatively coupled to the second terminal and to the delay stage. The sixth terminal is operatively coupled to the delay stage. The third transistor has a seventh terminal, such as a drain, source, or other suitable terminal, an eighth terminal, such as a drain, source, or other suitable terminal, and a ninth terminal, such as a gate or other suitable control terminal. The seventh terminal is operatively coupled to the fourth terminal. The eighth terminal is operatively coupled to the sixth terminal. The ninth terminal operatively coupled to the fifth terminal. The fourth transistor has a tenth, eleventh, and twelfth terminal. The tenth terminal is operatively coupled to the seventh terminal. The eleventh terminal is operatively coupled to the eighth terminal. The twelfth terminal is operative to receive the clock signal.

In one example, a flip-flop circuit includes a latch stage and a sense amplifier stage. The latch stage is operative to generate an output in response to a first and second input. The output is generated in response to the first input after a first delay. The output is generated in response to the second input after a second delay that is greater than the first delay. The sense amplifier stage is operative to generate the first and second inputs in response to a clock signal. The first input is generated after the second delay. The second input is generated after the first delay.

In one example, the flip-flop includes a delay stage. The delay stage includes a first and second branch. The first branch is operative to provide the first delay. The second branch is operative to provide the second delay.

In one example, the first branch includes a first transistor. The first transistor includes a first terminal, such as a drain, source, or other suitable terminal, a second terminal, such as a drain, source, or other suitable terminal, and a third terminal, such as a gate or other suitable control terminal. The first terminal is operatively coupled to the output stage. The second terminal is operatively coupled to the input stage. The third terminal is operatively coupled to the output stage. The second branch includes a second transistor. The second transistor includes a fourth terminal, such as a drain, source, or other suitable terminal, a fifth terminal, such as a drain, source, or other suitable terminal, and a sixth terminal, such as a gate or other suitable control terminal. The fifth terminal is operatively coupled to the input stage. The sixth terminal is operatively coupled to the output stage. The second branch includes a third transistor. The third transistor has a seventh terminal, such as a drain, source, or other suitable terminal and an eight terminal, such as a drain, source, or other suitable terminal. The seventh terminal is operatively coupled to the output stage. The eighth terminal is operatively coupled to the fourth terminal.

In one example, the second branch comprises at least one more delay element than the first branch. The delay element includes a metal oxide semiconductor field effect transistor.

In one example, a flip-flop includes an output stage, a delay stage, and a latch stage. The output stage includes a first, second, third, and fourth transistor. The first transistor has a first terminal, such as a drain, source, or other suitable terminal, a second terminal, such as a drain, source, or other suitable terminal, and a third terminal, such as a gate or other suitable control terminal. The first terminal is operatively coupled to a voltage source. The third terminal that is operative to receive a clock signal. The second transistor has a fourth terminal, such as a drain, source, or other suitable terminal, a fifth terminal, such as a drain, source, or other suitable terminal, and a sixth terminal, such as a gate or other suitable control terminal. The fourth terminal is operatively coupled to the first terminal. The fifth terminal is operatively coupled to the second terminal. The third transistor has a seventh terminal, such as a drain, source, or other suitable terminal, an eighth terminal, such as a drain, source, or other suitable terminal, and a ninth terminal, such as a gate or other suitable control terminal. The seventh terminal is operatively coupled to the fourth terminal. The eighth terminal is operatively coupled to the sixth terminal. The ninth terminal operatively coupled to the fifth terminal. The fourth transistor has a tenth terminal, such as a drain, source, or other suitable terminal, an eleventh terminal, such as a drain, source, or other suitable terminal, and a twelfth terminal, such as a gate or other suitable control terminal. The tenth terminal is operatively coupled to the seventh terminal. The eleventh terminal is operatively coupled to the eighth terminal. The twelfth terminal is operative to receive the clock signal. The delay stage includes a fifth, sixth, and seventh transistor. The fifth transistor has a thirteenth terminal, such as a drain, source, or other suitable terminal, a fourteenth terminal, such as a drain, source, or other suitable terminal, and a fifteenth terminal, such as a gate or other suitable control terminal. The thirteenth terminal is operatively coupled to the fifth terminal. The fourteenth terminal is operatively coupled to an input stage. The fifteenth terminal operatively coupled to the sixth terminal. The sixth transistor has a sixteenth terminal, such as a drain, source, or other suitable terminal, a seventeenth terminal, such as a drain, source, or other suitable terminal, and an eighteenth terminal, such as a gate or other suitable control terminal. The seventeenth terminal is operatively coupled to the input stage. The eighteenth terminal is operatively coupled to the ninth terminal. The seventh transistor has a nineteenth terminal, such as a drain, source, or other suitable terminal, a twentieth terminal, such as a drain, source, or other suitable terminal, and a twenty-first terminal, such as a gate or other suitable control terminal. The nineteenth terminal is operatively coupled to the eighth terminal. The twentieth terminal is operatively coupled to the sixteenth terminal. The twenty-first terminal is operatively coupled to the voltage source. The latch stage is operatively coupled to the second and eleventh terminals.

In one example, the flip-flop includes an input stage. The input stage includes an eighth, ninth, tenth, and eleventh transistor. The eighth transistor has a twenty-second terminal, such as a drain, source, or other suitable terminal, a twenty-third terminal, such as a drain, source, or other suitable terminal, and a twenty-fourth terminal, such as a gate or other suitable control terminal. The twenty-second terminal is operatively coupled to the fourteenth terminal. The twenty-fourth terminal is operative to receive an input signal. The ninth transistor has a twenty-fifth terminal, such as a drain, source, or other suitable terminal, a twenty-sixth terminal, such as a drain, source, or other suitable terminal, and a twenty-seventh terminal, such as a gate or other suitable control terminal. The twenty-fifth terminal is operatively coupled to the twenty-second terminal. The twenty-sixth terminal is operatively coupled to the seventeenth terminal. The twenty-seventh terminal is operatively coupled to the voltage source. The tenth transistor has a twenty-eighth terminal, such as a drain, source, or other suitable terminal, a twenty-ninth terminal, such as a drain, source, or other suitable terminal, and a thirtieth terminal, such as a gate or other suitable control terminal. The twenty-eighth terminal is operatively coupled to the twenty-sixth terminal. The twenty-ninth terminal is operatively coupled to the twenty-third terminal. The thirtieth terminal is operative a receive an inverse of the input signal. The eleventh transistor has a thirty-first terminal, such as a drain, source, or other suitable terminal, a thirty-second terminal, such as a gate or other suitable control terminal, and a thirty-third terminal, such as a drain, source, or other suitable terminal. The thirty-first terminal is operatively coupled to the twenty-ninth terminal. The thirty-second terminal is operative to receive the clock signal. The thirty-third terminal is operatively coupled to a second voltage source that is less that the voltage source.

In one example, the first, second, third, and fourth transistors are p-channel metal oxide semiconductor field effect transistors. The fifth, sixth, seventh, eighth, ninth, tenth, and eleventh transistors are n-channel metal oxide semiconductor field effect transistors.

As used herein, the term module, circuit and/or stage can include an electronic circuit, one or more processors (e.g., shared, dedicated, or group of processors such as but not limited to microprocessors, DSPs, or central processing units) and memory that execute one or more software or firmware programs, a combinational logic circuit, an ASIC, and/or other suitable components that provide the described functionality.

Figure 2:
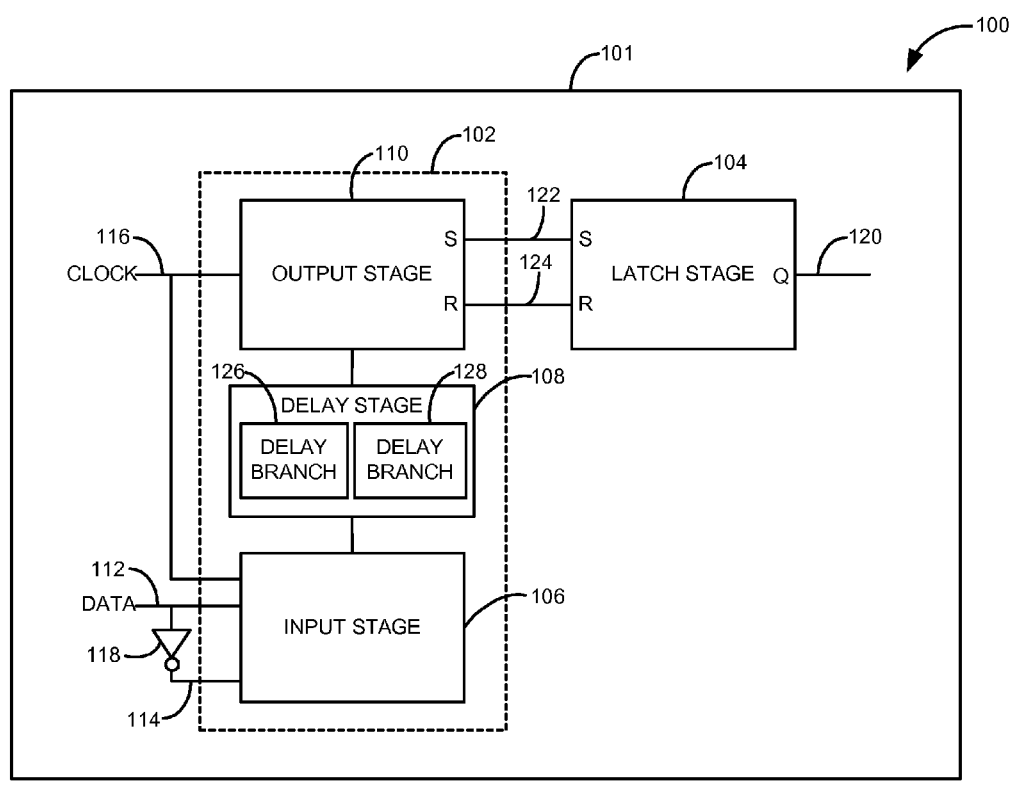
FIG. 2 is a functional block diagram of a sense amplifier based flip-flop that exhibits a balanced delay.

Referring now to FIG. 2, a functional block diagram of a sense amplifier based flip-flop 100 is depicted. The sense amplifier based flip-flop 100 may be implemented in an integrated circuit 101 such as a graphics processor, a central processing unit, memory (static, dynamic, low latency nonvolatile memory such as flash and/or any suitable electronic data storage), a finite state machine, an ASIC, or any other suitable digital integrated circuit that can employ the disclosed circuit.

The sense amplifier based flip-flop 100 includes a sense amplifier stage 102 and a latch stage 104. The sense amplifier stage 102 includes an input stage 106, a delay stage 108, and an output stage 110. The input stage 106 is operative to receive a first and second input signal 112, 114 and a clock signal 116. The first and second input signals 112, 114 are complementary. For example, when the first input signal 112 is high, the second input signal 114 is low and vice versa. Therefore, an inverter 118 may be operative to receive the first input signal 112 and generate the second input signal 114 or vice versa.

The output stage 110 is operative to receive the clock signal 116 and generate a set signal 122 and a reset signal 124. The set and reset signals 122, 124 are based on the first and second input signals 112, 114 and the clock signal 116.

The delay stage 108 is operatively coupled to the input stage 106 and the output stage 110. The delay stage 108 may include a first and second delay branch 126, 128. The first delay branch 126 is operative to provide a first delay and the second branch is operative to provide a second delay that is greater than the first delay. More specifically, the set signal 122 may transition to a high or low level after the first delay and the reset signal 124 may transition to a high or low level after the second delay.

The latch stage 104 is operative to receive the set and reset signals 122, 124 and generate an output signal 120 based thereon. In some embodiments, the latch stage 104 is a set-reset latch as is commonly known in the art. In other embodiments, the latch stage 104 is an inverted set-reset latch as is commonly known in the art. The latch stage 104 has an imbalanced delay that is complementary to that of the sense amplifier stage 102. More specifically, the output signal 120 may transition to a high or low level based on the set signal 122 after the second delay and the output signal 120 may transition to a high or low level based on the reset signal 124 after the first delay. In this manner, the sense amplifier based flip-flop 100 exhibits an overall balanced delay between the clock signal 116 and the output signal 120.

Figure 3:
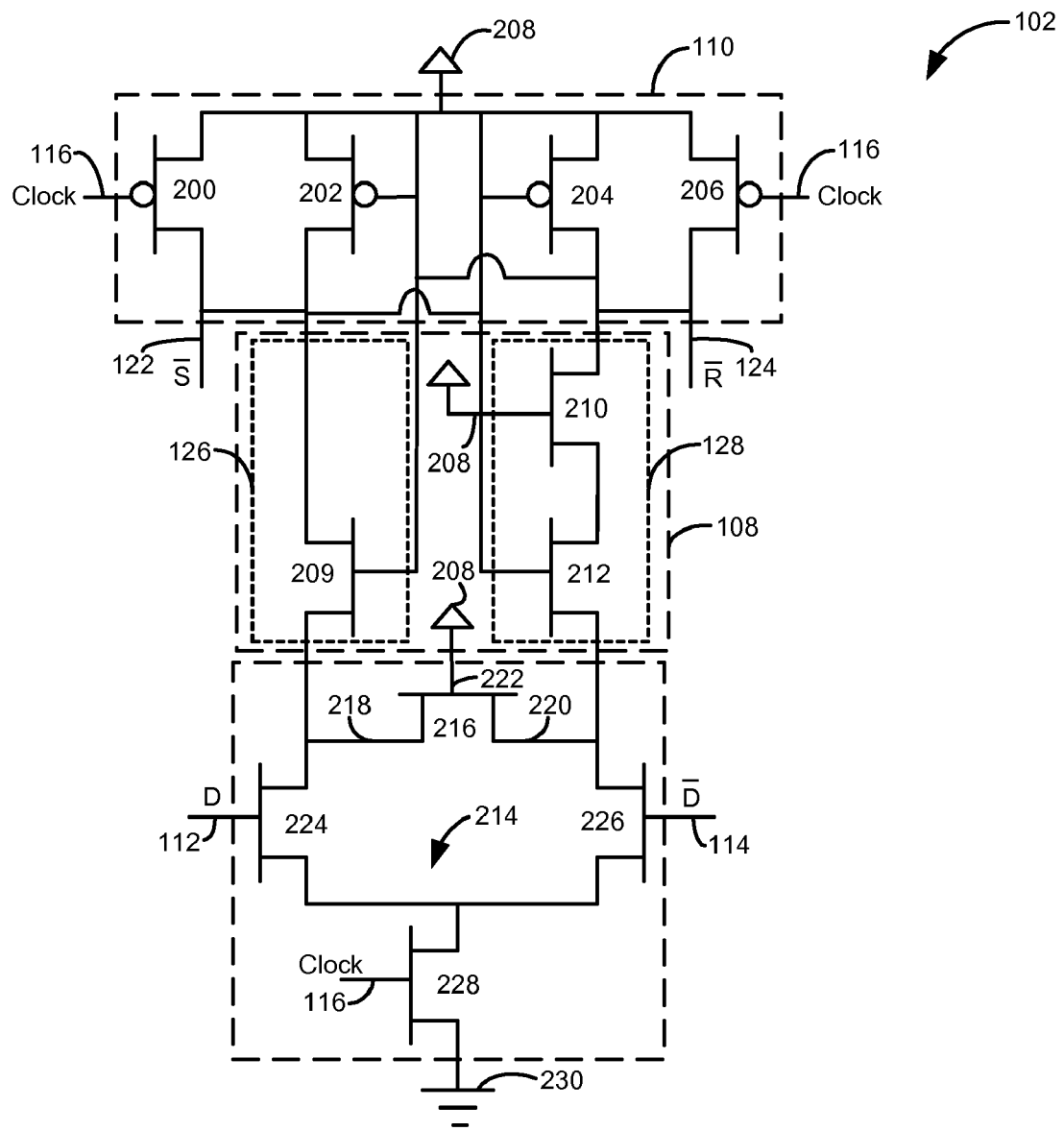
FIG. 3 is an exemplary circuit diagram of a sense amplifier stage of the sense amplifier based flip-flop of FIG. 2.

Referring now to FIG. 3, an exemplary circuit diagram of the sense amplifier stage 102 is depicted. The output stage 110 may include transistors 200, 202, 204, and 206. In some embodiments, transistors 200, 202, 204, and 206 are p-channel metal oxide semiconductor field effect transistors (MOSFET) implemented in 65 nm technology that each have a length of 0.06 micrometers and an approximate width of 150 nanometers. However, it will be recognized that any suitable configuration may be used for any of the transistors.

Transistor 200 includes a gate terminal that is operative to receive the clock signal 116, a source terminal that is operatively coupled to a first voltage source 208, and a drain terminal that is operative to provide the set signal 122. A source terminal of transistor 202 is operatively coupled to the source terminal of transistor 200. A gate terminal of transistor 202 is operatively coupled to the first voltage source 208. A drain terminal of transistor 202 is operatively coupled to the drain terminal of transistor 200.

Transistor 206 includes a gate terminal that is operative to receive the clock signal 116, a source terminal that is operatively coupled to a first voltage source 208, and a drain terminal that is operative to provide the reset signal 124. A source terminal of transistor 204 is operatively coupled to the first voltage source 208. A gate terminal of transistor 204 is operatively coupled to the voltage source 208 and the drain terminal of transistor 202. A drain terminal of transistor 204 is operatively coupled to the gate terminal of transistor 202 and the drain terminal of transistor 206.

The delay stage 108 may include delay elements 209, 210, and 212. More specifically, the first delay branch 126 may include delay element 209 and the second delay branch 128 may include delay elements 210 and 212. Delay element 209 is operative to provide the first delay and delay elements 210, 212 are operative to provide the second delay, which is greater than the first delay. In this manner, an additional delay element in the second delay branch 128 provides an imbalanced delay in the sense amplifier stage 102 that is complementary to the imbalanced delay of the latch stage 104.

In some embodiments, the delay elements 209, 210, and 212 are n-channel MOSFETs implemented in 65 nm technology that each have an approximate length of 0.06 micrometers. Delay element 209 may have an approximate width of 150 nanometers while delay elements 210 and 212 may have a width of 250 micrometers. Delay elements 210 and 212 should be sized carefully because they also affect the robustness of the sense amplifier stage 102. Delay elements 210 and 212 should be sized such that a delay from the drain terminal of transistor 226 to the drain terminal of transistor 206 is less than a delay from the drain terminal of transistor 226 to the drain terminal of transistor 200.

Delay element 209 may include a drain terminal operatively coupled to the drain terminal of transistor 202, a gate terminal operatively coupled to the gate terminal of transistor 202, and a source terminal operatively coupled to the input stage 106. Delay element 210 may include a drain terminal operatively coupled to the drain terminal of transistor 204, a gate terminal operatively coupled to the first voltage source 208, and a source terminal operatively coupled to the input circuit 106.

The input stage 114 may include a differential amplifier 214 and a switch 216. The switch 216 may include a first terminal 218, a second terminal 220, and a control terminal 222. The control terminal 222 is operatively coupled to the first voltage source 208. The first and second terminals 218, 220 are operatively coupled to the differential amplifier 214. In some embodiments, the switch may be an n-channel MOSFET implemented in 65 nm technology with an approximate length of 0.06 micrometers and an approximate width of 150 nanometers. In some embodiments, the first terminal 218 may be a drain terminal, the second terminal 220 may be a source terminal, and the control terminal 222 may be a gate terminal. In other embodiments, the first terminal 218 may be a source terminal, the second terminal 220 may be a drain terminal, and the control terminal 222 may be a gate terminal.

The differential amplifier 214 may include transistors 224, 226 and 228. Transistor 224 may include a drain terminal operatively coupled to the first terminal 218 and a gate terminal that is operative to receive the first input signal 112. Transistor 226 may include a drain terminal operatively coupled to the second terminal 220 and a gate terminal that is operative to receive the second input signal 114. Transistor 228 may include a drain terminal operatively coupled the source terminals of transistors 224 and 226, a gate terminal that is operative to receive the clock signal 116, and a source terminal operatively coupled to a second voltage source 230 that is less than the first voltage source 208. In some embodiments, the first voltage source 208 may be 1.1 Volts and the second voltage source 230 may be ground.

Figure 4:
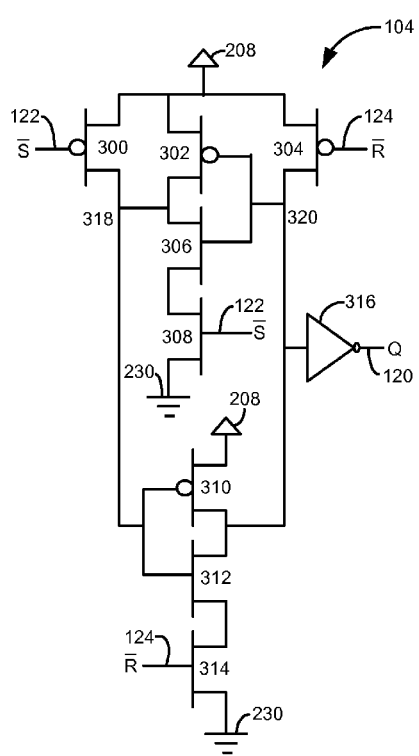
FIG. 4 is an exemplary circuit diagram of a latch stage of the sense amplifier based flip-flop of FIG. 2.

Referring now to FIG. 4, an exemplary circuit diagram of the latch stage 104 is depicted. The latch stage 104 may include transistors 300, 302, 304, 306, 308, 310, 312, 314 and an inverter 316. Transistor 300 may include a source terminal operatively coupled to the first voltage source 208 and a gate terminal operative to receive the set signal 122. Transistor 302 may include a source terminal operatively coupled to the first voltage source 208 and a drain terminal operatively coupled to a drain of transistor 300. Transistor 304 may include a source terminal operatively coupled to the first voltage source 208, a gate terminal operative to receive the reset signal 124, and a drain terminal operatively coupled to a gate terminal of transistor 302. Transistor 306 may include a drain terminal operatively coupled to the drain terminal of transistor 302 and a gate terminal operatively coupled to the gate terminal of transistor 302. Transistor 308 may include a drain terminal operatively coupled to a source terminal of transistor 306, a gate terminal operative to receive the set signal 122, and a source terminal operatively coupled to the second voltage source 230.

Transistor 310 may include a source terminal operatively coupled to the first voltage source 208 and a gate terminal operatively coupled to the drain terminal of transistor 300. Transistor 312 may include a drain terminal operatively coupled to a drain terminal of transistor 310 and a gate terminal operatively coupled to the gate terminal of transistor 310. Transistor 314 may include a drain terminal operatively coupled to a source terminal of transistor 312, a gate terminal operative to receive the reset signal 124, and a source terminal operatively coupled to the second voltage source 230. The inverter 316 may include an input operatively coupled to the drain terminal of transistors 304, 310, and 312 and an output that is operative to provide the output signal 120.

In some embodiments, transistors 300, 302, 304, and 310 are p-channel MOSFETs implemented in 65 nm technology that each have an approximate length of 0.06 micrometers and an approximate width of 150 nanometers and transistors 306, 308, 312, and 314 are n-channel MOSFETs implemented in 65 nm technology that each have a length of 0.06 micrometers and a width of 150 nanometers.

Referring to FIGS. 3 and 4, during operation, the set and reset signals 122, 124 are held high through transistors 200 and 206 of the sense amplifier stage 102 when the clock signal 116 is low. Therefore, a portion of the circuit, such as transistors 300 and 304, are off and transistors 308 and 314 are on. Transistors 302, 306, 310 and 312 keep the previous state of the flip-flop. If the first input signal 112 is high, the set signal 122 is pulled low after the first delay at a rising edge of the clock signal 116. The reset signal 124 remains high due to a positive feedback loop in the sense amplifier stage 102. When the set signal is pulled low, transistor 300 turns on and transistor 308 turns off. A rising signal at node 318 passes through transistor 312 and the inverter 316, which forces the output signal 120 high. It is worth noticing that power consumption is reduced compared to a push pull type SR-Latch configuration due to transistor 308 being off while transistor 300 is pulling up node 318. If the second input signal 114 is high at a rising edge of the clock signal 116, the reset signal 124 is forced low after the second delay, which is longer than the first delay. When the reset signal 124 is low, transistor 304 turns on and transistor 314 turns off. A signal transition at node 320 passes through the inverter 316 and sets the output signal 120 low.

Figure 5:
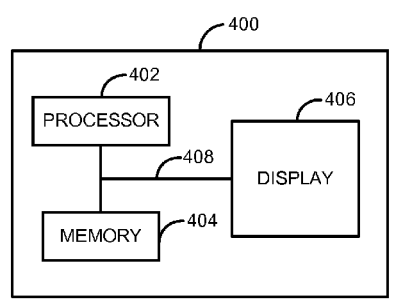
FIG. 5 is an exemplary implementation of the sense amplifier based flip-flip in a device.

Referring now to FIG. 5, the integrated circuit 101 may be implemented in a device 400 such as a wireless phone, a mobile and/or stationary computer, a printer, a LAN interface (wireless and/or wired), a media player, a video decoder and/or encoder, and/or any other suitable digital device. The device 400 may include, among other things, a processor 402 such as a graphics processor (or core) and/or one or more central processing units, memory 404 such as RAM, ROM, static, discrete logic, dynamic, low latency nonvolatile memory such as flash and/or any suitable optical magnetic or electronic data storage that stores executably instructions that may be executed by one or more processors 402. The memory 404 may also include non local memory such as networked memory available via an intranet server, Internet server or any suitable non local memory. The device 400 also includes a display 406 and/or any other suitable circuits, interfaces, structures or functional operations. The processor 402, memory 404, and/or display 406 may communicate via a bus 408 and/or any other suitable communication mechanism whether the bus is local, wireless, a network connection or any suitable link. The memory may be any suitable computer readable media contains instructions adapted to provide a cell library where the cell library includes data representing the circuits as described above. In addition, the memory may include instructions that when executed are adapted to provide the circuit designed to execute the circuit design program which then provides the cell or data representing the circuits as described above.

Figure 6:
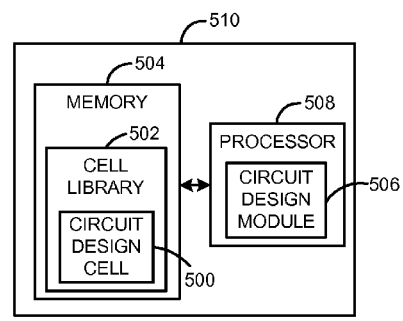
FIG. 6 is an exemplary implementation of the sense amplifier based flip-flop in a circuit design cell.

Referring now to FIG. 6, the sense amplifier based flip-flop 100 may be implemented as a circuit design cell 500 of a cell library 502 that is stored in memory 504. A circuit design module 506 that is executed on a processor 508 of an integrated circuit design system 510 may call the circuit design cell 500. The circuit design module 506 may be any suitable integrated circuit design program known to those skilled in the art.

As noted above, the sense amplifier based flip-flop, among other advantages, achieves a balanced rise/fall delay, which reduces glitch in the data path and consequently power consumption. In addition, the sense amplifier based flip-flop can have a reduced transistor count, which can minimize die size and hence cost. The die size may also be comparable with standard cell libraries that include a PowerPC Master-Slave Latch. Other advantages will be recognized by those of ordinary skill in the art.

While this disclosure includes particular examples, it is to be understood that the disclosure is not so limited. Numerous modifications, changes, variations, substitutions and equivalents will occur to those skilled in the art without departing from the spirit and scope of the present disclosure upon a study of the drawings, the specification and the following claims.

What is claimed is:

1. A circuit comprising:
   an input stage that is operative to receive a clock signal and a first and second input signal;
   an output stage that is operative to receive the clock signal and to generate a first and second output signal based on the clock signal and the first and second input signals; and
   a delay stage that is operatively coupled to the input and output stages and that comprises a first and second branch, wherein the second branch includes at least one more delay element than the first branch.

2. The circuit of claim 1 wherein:
   the first branch comprises a first transistor having a first terminal operatively coupled to the output stage, a second terminal operatively coupled to the input stage, and a third terminal operatively coupled to the output stage; and
   the second branch comprises a second transistor having a fourth terminal, a fifth terminal operatively coupled to the input stage, and a sixth terminal operatively coupled to the output stage and a third transistor having a seventh terminal operatively coupled to the output stage and an eighth terminal operatively coupled to the fourth terminal.

3. The circuit of claim 1 wherein the delay element comprises a metal oxide semiconductor field effect transistor, the first input signal is an inverse of the second input signal, and the first output signal is a set signal and the second signal is a reset signal.

4. The circuit of claim 1 further comprising a latch stage operatively coupled to the output stage that is operative to generate an output signal based on the first and second output signals.

5. The circuit of claim 4 wherein when the clock signal is low, a first portion of said latch stage is off and a second portion is on.

6. The circuit of claim 5 wherein during a rising edge of the clock signal and when the first input signal is high, the first portion of the latch stage turns on and the second portion turns off.

7. The circuit of claim 4 wherein the latch stage is one of a set-reset latch and an inverted set-reset latch.

8. The circuit of claim 4 wherein the latch stage is operative to generate the output signal after a first delay when the first output signal transitions to one of a high and low level and to generate the output signal after a second delay that is greater than the first delay when the second output signal transitions to one of a high and low level.

9. The circuit of claim 8 wherein the output stage generates the first output signal after the second delay and the second output signal after the first delay.

10. The circuit of claim 1 wherein the input stage comprises:
    a first transistor having a first, second, and third terminal, wherein the first terminal is operatively coupled to the first branch and the third terminal is operative to receive the first input signal;
    a second transistor having a fourth and fifth terminal, wherein the fourth terminal is operatively coupled to the first terminal and the fifth terminal is operatively coupled to the second branch;
    a third transistor having a sixth, seventh and eighth terminal, wherein the sixth terminal is operatively coupled to the fifth terminal, the seventh terminal is operatively coupled to the second terminal, and the eight terminal is operatively coupled to the second input signal; and
    a fourth transistor having a ninth and tenth terminal, wherein the ninth terminal is operatively coupled to the second and seventh terminals and the tenth terminal is operative to receive the clock signal.

11. The circuit of claim 1 wherein the output stage comprises:
- a first transistor having a first terminal, a second terminal operative to provide the first output signal, and a third terminal operative to receive the clock signal;
- a second transistor having a fourth terminal operatively coupled to the first terminal, a fifth terminal operatively coupled to the second terminal and to the delay stage, and a sixth terminal operatively coupled to the delay stage;
- a third transistor having a seventh terminal operatively coupled to the fourth terminal, an eighth terminal operatively coupled to the sixth terminal, and ninth terminal operatively coupled to the fifth terminal; and
- a fourth transistor having a tenth terminal operatively coupled to the seventh terminal, an eleventh terminal operatively coupled to the eighth terminal and a twelfth terminal is operative to receive the clock signal.

12. An Integrated circuit comprising:
- a latch state that is operative to generate an output in response to a first and second input, wherein the output is generated in response to the first input after a first delay and the output is generated in response to the second input after a second delay that is greater than the first delay; and
- a sense amplifier stage that is operative to generate the first and second inputs in response to a clock signal, wherein the first input is generated after the second delay and the second input is generated after the first delay, wherein the sense amplifier stage comprises a delay stage that comprises a first branch that is operative to provide the first delay and a second branch that is operative to provide the second delay and wherein the second branch includes at least one more delay element than the first branch.

13. The integrated circuit of claim 12 wherein:
- the first branch comprises a first transistor having a first terminal operatively coupled to the output stage, a second terminal operatively coupled to the input stage, and a third terminal operatively coupled to the output stage; and
- the second branch comprises a second transistor having a fourth terminal, a fifth terminal operatively coupled to the input stage, and a sixth terminal operatively coupled to the output stage and a third transistor having a seventh terminal operatively coupled to the output stage and an eighth terminal operatively coupled to the fourth terminal.

14. The integrated circuit of claim 12 wherein the delay element comprises a metal oxide semiconductor field effect transistor.

15. A flip-flop comprising:
an output stage that comprises:
- a first transistor having a first terminal operatively coupled to a voltage source, a second terminal, and a third terminal that is operative to receive a clock signal,
- a second transistor having fourth terminal operatively coupled to the first terminal, a fifth terminal operatively coupled to the second terminal, and a sixth terminal;
- a third transistor having a seventh terminal operatively coupled to the fourth terminal, an eighth terminal operatively coupled to the sixth terminal, and a ninth terminal operatively coupled to the fifth terminal; and
- a fourth transistor having a tenth terminal operatively coupled to the seventh terminal, an eleventh terminal operatively coupled to the eighth terminal, and a twelfth terminal that is operative to receive the clock signal;
a delay stage that comprises a first and second branch, wherein the second branch includes at least one more delay element than the first branch,
wherein the first branch comprises:
- a fifth transistor having a thirteenth terminal operatively coupled to the fifth terminal, a fourteenth terminal operatively coupled to an input stage, and a fifteenth terminal operatively coupled to the sixth terminal, and
wherein the second branch comprises:
- a sixth terminal having an sixteenth terminal, a seventeenth terminal operatively coupled to the input stage, and an eighteenth terminal operatively coupled to the ninth terminal, and
- a seventh transistor having a nineteenth terminal operatively coupled to the eighth terminal, a twentieth terminal operatively coupled to the sixteenth terminal, and a twenty-first terminal operatively couple to the voltage source; and
a latch stage operatively coupled to the second and eleventh terminals.

16. The flip-flop of claim 15 further comprising an input stage that comprises:
- an eighth transistor having a twenty-second terminal operatively coupled to the fourteenth terminal, a twenty-third terminal, and a twenty-fourth terminal that is operative to receive an input signal;
- a ninth transistor having a twenty-fifth terminal operatively coupled to the twenty-second terminal, a twenty-sixth terminal operatively coupled to the seventeenth terminal, and a twenty-seventh terminal operatively coupled to the voltage source;
- a tenth transistor having a twenty-eighth terminal, operatively coupled to the twenty-sixth terminal, a twenty-ninth terminal operatively coupled to the twenty-third terminal, and a thirtieth terminal that is operative a receive an inverse of the input signal; and
- an eleventh transistor having a thirty-first terminal operatively coupled to the twenty-ninth terminal, a thirty-second terminal that is operative to receive the clock signal, and a thirty-third terminal operatively coupled to a second voltage source that is less that the voltage source.

17. The flip-flop of claim 16 wherein the first, second, third, and fourth transistors are p-channel metal oxide semiconductor field effect transistors.

18. The hip-flop of claim 16 wherein the fifth, sixth, seventh, eighth, ninth, tenth, and eleventh transistors are n-channel metal oxide semiconductor field effect transistors.

19. A device comprising an integrated circuit that comprises:
- a latch stage that is operative to generate an output in response to a first and second input, wherein the output is generated in response to the first input after a first delay and the output is generated in response to the second input after a second delay that is greater than the first delay;
- a sense amplifier stage that is operative to generate the first and second inputs in response to a clock signal, wherein the first input is generated after the second delay and the second input is generated after the first delay, wherein the sense amplifier stage comprises a stage that comprises a first branch that is operative to provide the first delay and a second branch that is operative to provide the second delay and wherein the second branch includes at least one more delay element than the first branch.

20. The device of claim 19 further comprising a display that communicates with the integrated circuit via a bus, wherein the integrated circuit is at least one of: a processor and memory.

21. The device of claim 19 wherein when the clock signal is low, a first portion of said latch stage is off and a second portion is on.

22. The device of claim 21 wherein during a rising edge of the clock signal and when the first input signal is high, the first portion of the latch stage turns on and the second portion turns off.

23. An integrated circuit design system comprising: a processor; and memory operatively coupled to the processor that comprises a circuit design cell, comprising:
a latch stage that is operative to generate an output in response to a first and second input, wherein the output is generated in response to the first input after a first delay and the output is generated in response to the second input after a second delay that is greater than the first delay; and
a sense amplifier stage that is operative to generate the first and second inputs in response to a clock signal, wherein the first input is generated after the second delay and the second input is generated after the first delay, wherein the sense amplifier stage comprises a delay stage that comprises a first branch that is operative to provide the first delay and a second branch that is operative to provide the second delay and wherein the second branch includes at least one more delay element than the first branch.

24. A computer readable media storing instructions, said instructions adapted to provide a cell library, said cell library comprising data representing:
an input stage that is operative to receive a clock signal and a first and second input signal;
an output stage that is operative to receive the clock signal and to generate a first and second output signal based on the clock signal and the first and second input signals; and
a delay stage that is operatively coupled to the input and output stages and that comprises a first and second branch, wherein the second branch includes at least one more delay element than the first branch.

25. The computer readable media of claim 24 containing data representing the cell library that contains data representing:
the first branch comprises a first transistor having a first terminal operatively coupled to the output stage, a second terminal operatively coupled to the input stage, and a third terminal operatively coupled to the output stage; and
the second branch comprising a second transistor having a fourth terminal, a fifth terminal operatively coupled to the input stage, and a sixth terminal operatively coupled to the output stage and a third transistor having a seventh terminal operatively coupled to the output stage and an eighth terminal operatively coupled to the fourth terminal.

26. The computer readable media of claim 24 containing data representing the cell library that contains data representing:
a first transistor having a first, second, and third terminal, wherein the first terminal is operatively coupled to the first branch and the third terminal is operative to receive the first input signal;
a second transistor having a fourth and fifth terminal, wherein the fourth terminal is operatively coupled to the first terminal and the fifth terminal is operatively coupled to the second branch;
a third transistor having a sixth, seventh and eight terminal, wherein the sixth terminal is operatively coupled to the fifth terminal, the seventh terminal is operatively coupled to the second terminal, and the eight terminal is operatively coupled to the second input signal; and
a fourth transistor having a ninth and tenth terminal, wherein the ninth terminal is operatively coupled to the second and seventh terminals and the tenth terminal is operative to receive the clock signal.

27. The computer readable media of claim 24 containing data representing the cell library that contains data representing:
a first transistor having a first terminal, a second terminal operative to provide the first output signal, and a third terminal operative to receive the clock signal;
a second transistor having a fourth terminal operatively coupled to the first terminal, a fifth terminal operatively coupled to the second terminal and to the delay stage, and a sixth terminal operatively coupled to the delay stage;
a third transistor having a seventh terminal operatively coupled to the fourth terminal, an eighth terminal operatively coupled to the sixth terminal, and ninth terminal operatively coupled to the fifth terminal; and
a fourth transistor having a tenth terminal operatively coupled to the seventh terminal, an eleventh terminal operatively coupled to the eighth terminal and a twelfth terminal is operative to receive the clock signal.

28. A computer readable media storing instructions, that when executed, provide a circuit design program that uses a cell library that comprises a data representing: a latch stage that is operative to generate an output in response to a first and second input, wherein the output is generated in response to the first input after a first delay and the output is generated in response to the second input after a second delay that is greater than the first delay; and
a sense amplifier stage that is operative to generate the first and second inputs in response to a clock signal, wherein the first input is generated after the second delay and the second input is generated after the first delay, wherein the sense amplifier stage comprises a delay stage that comprises a first branch that is operative to provide the first delay and a second branch that is operative to provide the second delay and wherein the second branch includes at least one more delay element than the first branch.

29. The computer readable media storing instructions of claim 28 wherein the data representing the sense amplifier stage includes data representing:
an input stage that is operative to receive a clock signal and a first and second input signal;
an output stage that is operative to receive the clock signal and to generate a first and second output signal based on the clock signal and the first and second input signals; and
the delay stage operatively coupled to the input and output stages.

30. The computer readable media storing instructions of claim 28 wherein the data representing the sense amplifier stage includes data representing:
the first branch that comprises a first transistor having a first terminal operatively coupled to the output stage, a second terminal operatively coupled to the input stage, and a third terminal operatively coupled to the output stage; and the second branch that comprises a second transistor having a fourth terminal, a fifth terminal operatively coupled to the input stage, and a sixth terminal operatively coupled to the output stage and a third transistor having a seventh terminal operatively coupled to the output stage and an eighth terminal operatively coupled to the fourth terminal.

31. The computer readable media storing instructions of claim 28 wherein the data representing the sense amplifier stage includes data representing:

a first transistor having a first, second, and third terminal, wherein the first terminal is operatively coupled to the first branch and the third terminal is operative to receive the first input signal;

a second transistor having a fourth and fifth terminal, wherein the fourth terminal is operatively coupled to the first terminal and the fifth terminal is operatively coupled to the second branch;

a third transistor having a sixth, seventh and eighth terminal, wherein the sixth terminal is operatively coupled to the fifth terminal, the seventh terminal is operatively coupled to the second terminal, and the eight terminal is operatively coupled to the second input signal; and a fourth transistor having a ninth and tenth terminal, wherein the ninth terminal is operatively coupled to the second and seventh terminals and the tenth terminal is operative to receive the clock signal.

32. The computer readable media storing instructions of claim 28 wherein the data representing the sense amplifier stage includes data representing:

a first transistor having a first terminal, a second terminal operative to provide the first output signal, and a third terminal operative to receive the clock signal;

a second transistor having a fourth terminal operatively coupled to the first terminal, a fifth terminal operatively coupled to the second terminal and to the delay stage, and a sixth terminal operatively coupled to the delay stage;

a third transistor having a seventh terminal operatively coupled to the fourth terminal, an eighth terminal operatively coupled to the sixth terminal, and ninth terminal operatively coupled to the fifth terminal; and a fourth transistor having a tenth terminal operatively coupled to the seventh terminal, an eleventh terminal operatively coupled to the eighth terminal and a twelfth terminal is operative to receive the clock signal.

33. A circuit, comprising:

a sense amplifier stage that comprises:

an input stage that is operative to receive a clock signal and a first and second input signal;

an output stage that is operative to receive the clock signal and to generate a first and second output signal based on the clock signal and the first and second input signals, wherein the first output signal is generated in response to the first input signal after a first delay and the second input signal is generated in response to the second input signal after a second delay that is greater than the first delay; and a delay stage, operatively coupled to the input and output stages, that comprises a first branch that is operative to provide the first delay and second branch that is operative to provide the second delay, wherein the second branch includes at least one more delay element than the first branch; and a latch stage, operatively coupled to the output stage, that is operative to generate a third output in response to the first output after the second delay and to generate the third output in response to the second output after a second delay that is greater than the first delay.

* * * * *